(12) United States Patent
Fadida

(10) Patent No.: US 11,943,553 B1
(45) Date of Patent: Mar. 26, 2024

(54) IMAGING SYSTEMS WITH DISTRIBUTED AND DELAY-LOCKED CONTROL

(71) Applicant: SEMICONDUCTOR COMPONENTS INDUSTRIES, LLC, Phoenix, AZ (US)

(72) Inventor: Gal Fadida, Shavi Tzion (IL)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 18/062,920

(22) Filed: Dec. 7, 2022

(51) Int. Cl.
| H04N 25/779 | (2023.01) |
| H03K 3/86 | (2006.01) |
| H04N 25/704 | (2023.01) |
| H04N 25/709 | (2023.01) |
| H04N 25/711 | (2023.01) |
| H04N 25/766 | (2023.01) |

(52) U.S. Cl.
CPC ............ *H04N 25/711* (2023.01); *H03K 3/86* (2013.01); *H04N 25/704* (2023.01); *H04N 25/709* (2023.01); *H04N 25/766* (2023.01); *H04N 25/779* (2023.01)

(58) Field of Classification Search
None
See application file for complete search history.

(56) References Cited

U.S. PATENT DOCUMENTS

| 5,477,198 | A | * | 12/1995 | Anderson | ............ | H03K 3/0322 |
| | | | | | | 331/177 R |
| 6,720,810 | B1 | * | 4/2004 | New | ...................... | H03K 5/135 |
| | | | | | | 327/158 |
| 7,019,573 | B2 | * | 3/2006 | Matsuno | ............... | H03L 7/0812 |
| | | | | | | 327/158 |
| 2006/0029173 | A1 | * | 2/2006 | Li | ......................... | H03L 7/0816 |
| | | | | | | 375/371 |
| 2006/0132208 | A1 | * | 6/2006 | Park | ......................... | H03L 7/10 |
| | | | | | | 327/182 |
| 2008/0191765 | A1 | * | 8/2008 | Kim | ...................... | H03L 7/0812 |
| | | | | | | 327/530 |

(Continued)

OTHER PUBLICATIONS

Min-Sun Keel et al., "A 4-tap 3.5μm 1.2 Mpixel Indirect Time-of-Flight CMOS Image Sensor with Peak Current Mitigation and Multi-User Interference4 Cancellation," 2021 IEEE International Solid State Circuits Conference.

(Continued)

*Primary Examiner* — Twyler L Haskins
*Assistant Examiner* — Wesley J Chiu
(74) *Attorney, Agent, or Firm* — Treyz Law Group, P.C.; Tianyi He

(57) ABSTRACT

An image sensor may include an array of image sensor pixels. Pixel control circuitry may provide control signals to the array of image sensor pixels. The pixel control circuitry may include a plurality of driver units that each generate a control signal for a different set of image sensor pixels. The control signal generated by each of the driver units may be delayed relative to each other. A voltage-controlled delay line may provide delayed outputs to each of the driver units. Delay lock circuitry coupled to the voltage-controlled delay line may fix the delay exhibited across the delay line using corresponding global and local bias voltages provided to each of the inverters in the delay line.

20 Claims, 8 Drawing Sheets

(56) References Cited

U.S. PATENT DOCUMENTS

| | | | | |
|---|---|---|---|---|
| 2009/0096906 A1* | 4/2009 | Senda | .................... | H04N 25/00 |
| | | | | 327/158 |
| 2011/0187907 A1* | 8/2011 | Takahashi | ............ | H03K 5/1565 |
| | | | | 341/169 |
| 2023/0137801 A1* | 5/2023 | Suess | ................ | H01L 27/14831 |
| | | | | 348/308 |

OTHER PUBLICATIONS

Bamji et al., "IMpixel 65nm BSI 320NHz demodulated TOF Image sensor with 3μm global shutter pixels and analog binning," Research Gate, Feb. 2018.

* cited by examiner

IMAGING SYSTEMS WITH DISTRIBUTED AND DELAY-LOCKED CONTROL

BACKGROUND

This relates generally to imaging systems and more specifically to imaging systems with time-of-flight (TOF) sensing capabilities.

A TOF sensor can include an illumination module and a sensor module. The illumination module can emit light onto an image scene. The emitted light reflects off of one or more objects and can be received by pixels in the sensor module to generate corresponding electrical charge. Based on the generated electrical charge, the sensor module can perform time-of-flight sensing calculations to determine depth and other scene information.

In the illustrative example of indirect TOF (iTOF) sensing where depth is not directly measured, pixels in the sensor module often modulate the generated charge to split the generated charge across multiple storage regions based on modulation control signals. This type of charge modulation can occur at a high frequency (i.e., the assertion and de-assertion of modulation control signals can occur quickly) and simultaneously across pixels in the entire pixel array. As a result, the operation of the power delivery network for the sensor module can be strained as high instantaneous current (e.g., at the concurrent rising edges when asserting the modulation control signals) is required to drive this type of charge modulation.

While described above in the context of iTOF sensing, this type of issue associated with instantaneous current draw straining the power delivery network can occur in other types of imaging systems or even non-imaging systems.

It is within this context that the embodiments herein arise.

DETAILED DESCRIPTION

Electronic systems such as digital cameras, computers, cellular telephones, automotive systems, and other electronic systems may include imaging systems or modules that gather light to capture one or more image frames that include information about their surrounding environments. The imaging system may have sensor circuitry including one or more arrays of image sensor pixels, which are sometimes referred to herein simply as sensor pixels or pixels. The active pixels in the array may include photosensitive elements such as pinned photodiodes that convert the incoming light into electric charge. The array may have any number of pixels (e.g., hundreds or thousands or more). Sensor circuitry may include control circuitry such as circuitry for controlling the pixels and readout circuitry for reading out image signals corresponding to the electric charge generated by the photosensitive elements.

Figure 1:
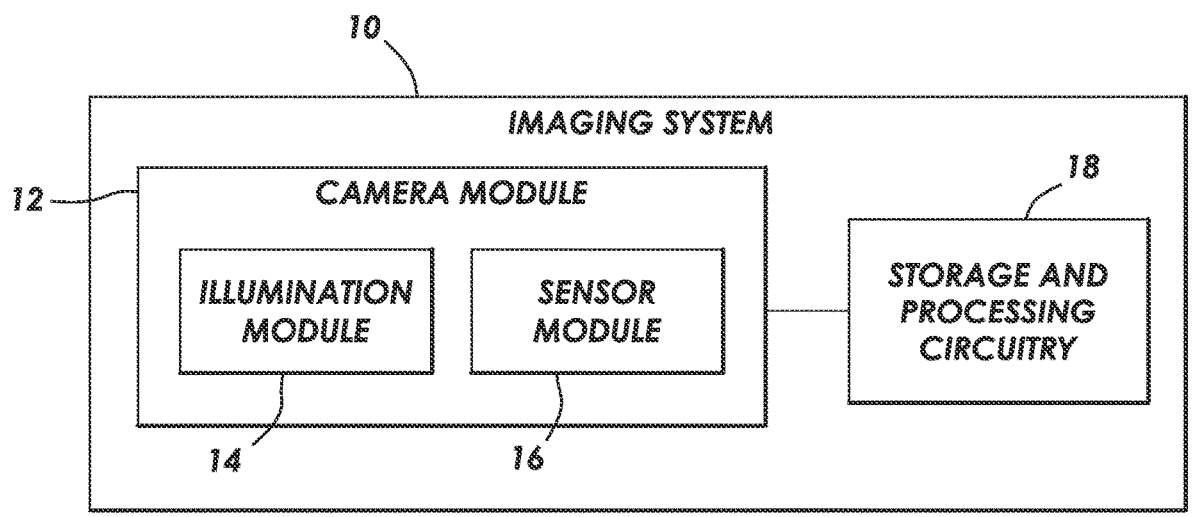
FIG. 1 is a diagram of an illustrative imaging system having a time-of-flight sensor in accordance with some embodiments.

FIG. 1 is a diagram of an illustrative imaging system such as an electronic device that uses sensor circuitry to capture images. Imaging system 10 of FIG. 1 may be a stand-alone camera, a cellular telephone, a tablet computer, a webcam, a video camera, a video surveillance system, an automotive imaging system, a video gaming system with imaging capabilities, an augmented reality and/or virtual reality system, an unmanned aerial vehicle system such as a drone, an industrial system, or any other desired imaging system or device that captures image data. Camera module 12, which is sometimes referred to as an imaging module, may be used to convert incoming light into digital image data. Camera module 12 may include one or more corresponding sensor modules 16, which are sometimes referred to as image sensor modules or image sensors. During image capture operations, light from a scene may be focused onto sensor module 16 by one or more corresponding lenses. Sensor module 16 may include circuitry for generating analog pixel image signals and circuitry for converting analog pixel image signals into corresponding digital image data, as examples. The digital image data may be provided to storage and processing circuitry 18.

Storage and processing circuitry 18 may include one or more integrated circuits such as digital signal processing circuits, image processing circuits, microprocessors, storage devices such as random-access memory and non-volatile memory, and/or other types of processing or memory circuitry. Storage and processing circuitry 18 may be implemented using components that are separate from camera module 12 and/or components that form part of camera module 12. When storage and processing circuitry 18 is implemented on different integrated circuits than those implementing camera module 12, the integrated circuits with circuitry 18 may be vertically stacked or packaged with the integrated circuits for camera module 12. Image data that has been captured by camera module 12 may be processed and stored using processing circuitry 18. As examples, the captured image data can be processed using an image processing engine on processing circuitry 18, using a digital signal processing engine on processing circuitry 18, using an imaging mode selection engine on processing circuitry 18, and/or using other portions of processing circuitry 18. The processed image data may, if desired, be provided to equipment external to camera module 12 and/or imaging system 10 such as a computer, an external display, and/or other devices using wired and/or wireless communications paths coupled to processing circuitry 18.

In some configurations described herein as an illustrative example, camera module 12 may implement a time-of-flight (TOF) sensor or camera. In these configurations, camera module 12 may include illumination module 14 configured to emit light for illuminating an image scene or more specifically one or more objects in the image scene. Sensor module 16 may be configured to gather reflected versions of the emitted light and to generate TOF information for the image scene such as depth or distance information for one or more of the objects, a depth or distance map of the image scene, a visible and/or infrared image of the image scene, and/or other information indicative of TOF information.

Figure 2:
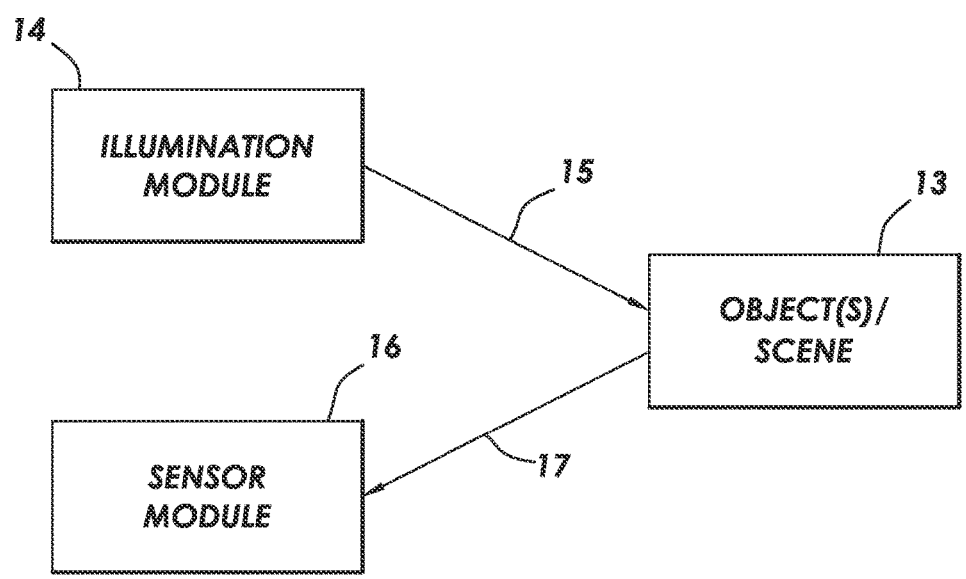
FIG. 2 is a diagram of an illustrative illumination module and an illustrative sensor module in accordance with some embodiments.

FIG. 2 is an illustrative diagram showing how illumination module 14 may emit light and how sensor module 16 may receive the corresponding reflected light after the emitted light reflects off of one or more objects. As shown in FIG. 2, illumination module 14 may include one or more light emitters, which are sometimes referred to herein as light sources or illumination devices. The light emitters may be coupled to driver circuitry and/or controller circuitry for controlling and driving the one or more light emitters. The light emitters may be implemented using and may include one or more light emitting diodes (LEDs), one or more laser diodes, one or more lasers, and/or one or more of other suitable light or illumination sources. The light emitters may emit light of any suitable wavelength such as visible light, infrared light, and/or light of other wavelengths.

A light emitter in illumination module 14 controlled by the corresponding driver circuitry may emit light 15 having any suitable characteristics such as a suitable waveform, a suitable peak amplitude or power, a suitable periodicity or frequency, a suitable number of light pulses, and/or other characteristics. Light 15 may reach one or more objects 13 in an image scene and reflect off one or more objects 13 as reflected light 17. Objects 13 may include any suitable objects, inanimate or animate, at different depths in the scene.

Reflected light 17 may be received at sensor module 16 (e.g., at one or more photosensitive elements in the active image pixels). Driver circuitry and/or control circuitry may control the pixels in sensor module 16 to generate one or more image frames based on reflected light 17 (e.g., by providing control signals coupled to transistors or other actuated elements in the pixels). In particular, based on the received control signals from the driver circuitry and/or control circuitry, the pixels may generate different portions of charge in response to reflected light 17 during an integration or exposure time period, may perform readout operations on the generated portions of charge during a readout time period, and may perform other suitable operations during other time periods.

The TOF sensor in FIG. 2 is merely illustrative. Illumination module 14 and sensor module 16 may each include other suitable circuitry such as power management and supply circuitry, processing circuitry, control circuitry, readout circuitry, timing circuitry, and/or clock generation circuitry. While illumination module 14 and sensor module 16 are shown as completely separate modules in FIGS. 1 and 2, this is merely illustrative. If desired, illumination module 14 and sensor module 16 may be coupled to and include shared circuitry in the camera module system such as shared power management and/or supply circuitry, shared modulation/demodulation circuitry, shared clock generation circuitry, a shared timing controller, shared signal generator circuitry, shared control circuitry, and/or shared storage circuitry.

Figure 3:
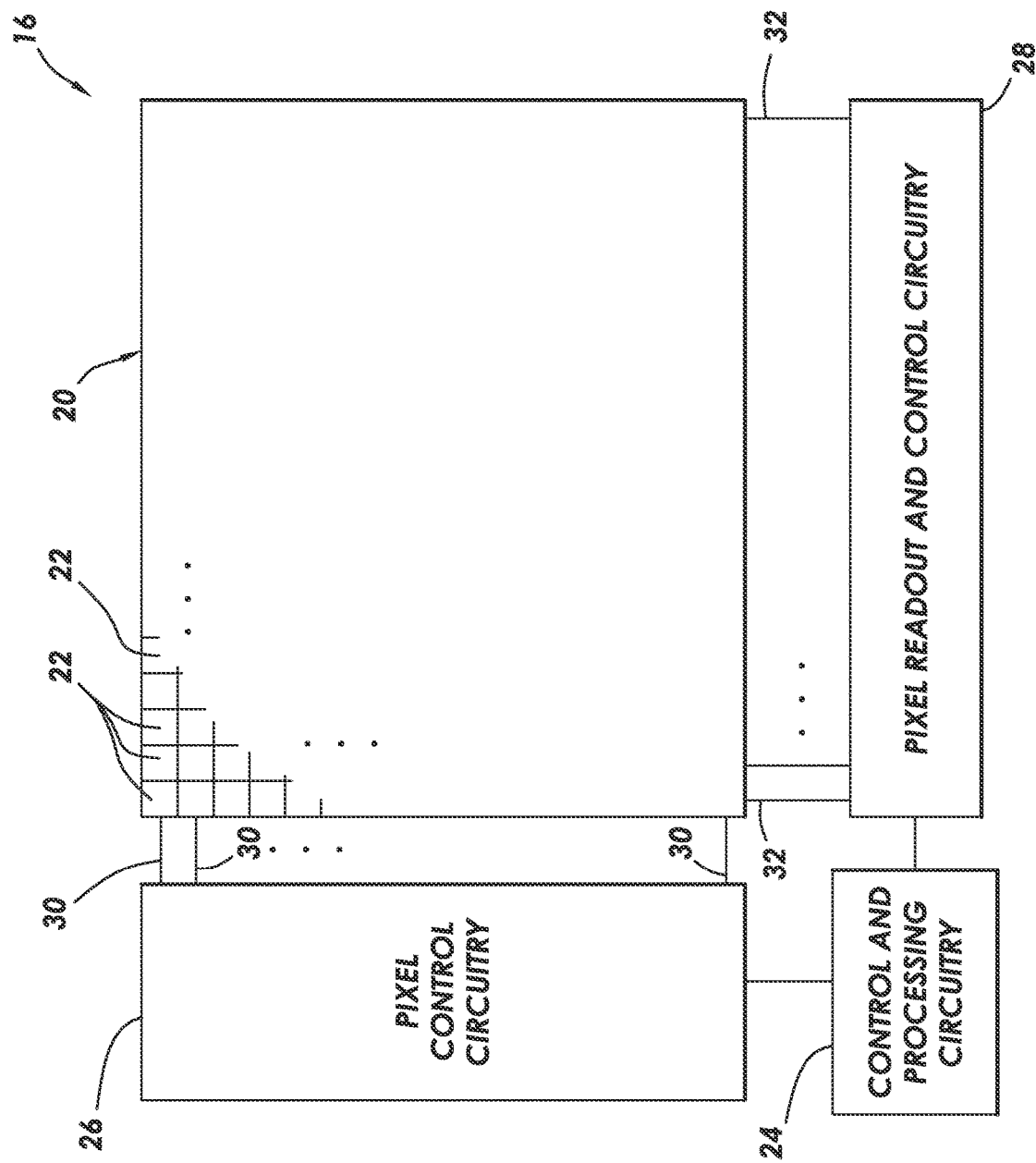
FIG. 3 is a diagram of illustrative sensor circuitry having a pixel array and pixel control, readout, and processing circuitry in accordance with some embodiments.

FIG. 3 is a diagram of an illustrative configuration for a sensor module such as sensor module 16 in FIGS. 1 and 2. As shown in FIG. 3, sensor module 16 may include a pixel array 20 containing sensor pixels 22 arranged in rows and columns and control and processing circuitry 24. Array 20 may contain, for example, tens, hundreds, or thousands of rows and columns of sensor pixels 22. Control circuitry 24 may be coupled to pixel control circuitry 26 and pixel readout and control circuitry 28 (sometimes referred to simply as pixel readout circuitry 28).

While pixel control circuitry 26 is shown in the example of FIG. 3 to be coupled to rows of pixels 22 in array 20 and pixel readout circuitry 28 is shown in the example of FIG. 3 to be coupled to columns of pixels 22 in array 20, this configuration is merely illustrative. If desired, pixel control circuitry 26 may be coupled to columns of pixels 22 in array 20 and/or pixel readout circuitry 28 may be coupled to rows of pixels 22 in array. In general, pixel control circuitry 26 and pixel readout circuitry 28 may each be coupled to lines (e.g., in a row-wise direction or in a column-wise direction) of pixels 22 in array 20.

Pixel control circuitry 26 may receive (row or column) addresses from control circuitry 24 and supply corresponding (row or column) control signals such as reset, anti-blooming or global shutter, pixel (row or column) select, modulation, storage, charge transfer, readout, sample-and-hold control signals to pixels 22 over (row or column) control paths 30. In some illustrative configurations described herein as an example, a first portion of pixel control circuitry 26 may be coupled to pixels 22 via column control paths to provide global shutter and modulation control signals while a second portion of pixel control circuitry 26 may be coupled to pixels 22 via row control paths to provide the remaining pixel control signals such as the reset, pixel (row or column) select, storage, charge transfer, readout, and/or sample-and-hold control signals.

One or more (column or row) readout paths 32 may be coupled to each line (e.g., column line) of pixels 22 in array 20. Paths 32 may be used for reading out image signals from pixels 22 and for supplying bias signals (e.g., bias currents or bias voltages) to pixels 22. Pixel readout circuitry 28 may receive image signals such as analog pixel values generated by pixels 22 over paths 32. Pixel readout circuitry 28 may include memory circuitry for storing calibration signals (e.g., reset level signals, reference level signals) and/or image signals (e.g., image level signals) read out from array 20, amplifier circuitry or a multiplier circuit, analog to digital conversion (ADC) circuitry, bias circuitry, latch circuitry for selectively enabling or disabling different portions of readout circuitry 28, or other circuitry that is coupled to one or more pixels 22 in array 20 for operating pixels 22 and/or for reading out image signals from pixels 22. ADC circuitry in readout circuitry 28 may convert analog pixel values received from array 20 into corresponding digital pixel values (sometimes referred to as digital image data or digital pixel data). Readout circuitry 28 may supply digital pixel data to control and processing circuitry 24 and/or processor 18 (FIG. 1) from pixels 22 for further processing such as digital signal processing.

If desired, pixel array 20 may also be provided with a filter array having multiple color and/or infrared filter elements each overlapping one or more pixels 22, thereby allowing a single image sensor to sample light of different colors or sets of wavelengths. In general, filter elements of any desired color and/or wavelength and in any desired pattern may be formed over any desired number of image pixels 22. In the illustrative example of time-of-flight sensing using an illumination source (e.g., in illumination module 14 in FIGS. 1 and 2), pixel array 20 may be provided with a correspond filter array that passes light having colors and/or frequencies emitted from the illumination source.

Sensor module 16 may include one or more arrays 20 of image pixels 22. Image pixels 22 may be formed in a semiconductor substrate using complementary metal-oxide-semiconductor (CMOS) technology or charge-coupled device (CCD) technology or any other suitable photosensitive devices technology. Image pixels 22 may be frontside illumination (FSI) image pixels or backside illumination (BSI) image pixels. If desired, array 20 may include pixels 22 of different types such as active pixels, optically shielded pixels, reference pixels, etc. If desired, sensor module 16 may include an integrated circuit package or other structure in which multiple integrated circuit substrate layers (e.g., from multiple wafers) or chips are vertically stacked with respect to each other.

Configurations in which imaging module 12 in FIG. 1 is configured to perform indirect TOF measurements based on phase differences between a modulated light signal emitted by illumination module 14 in FIG. 2 and the reflected modulated light signal from an object in an image scene received by sensor module 16 in FIG. 2 are described herein for illustrative purposes. In these configurations, sensor module 16 may include an array of active pixels 22, each configured to demodulate the received light signal based on a sensor modulation frequency to generate corresponding charge portions useable to generate TOF information.

Figure 4:
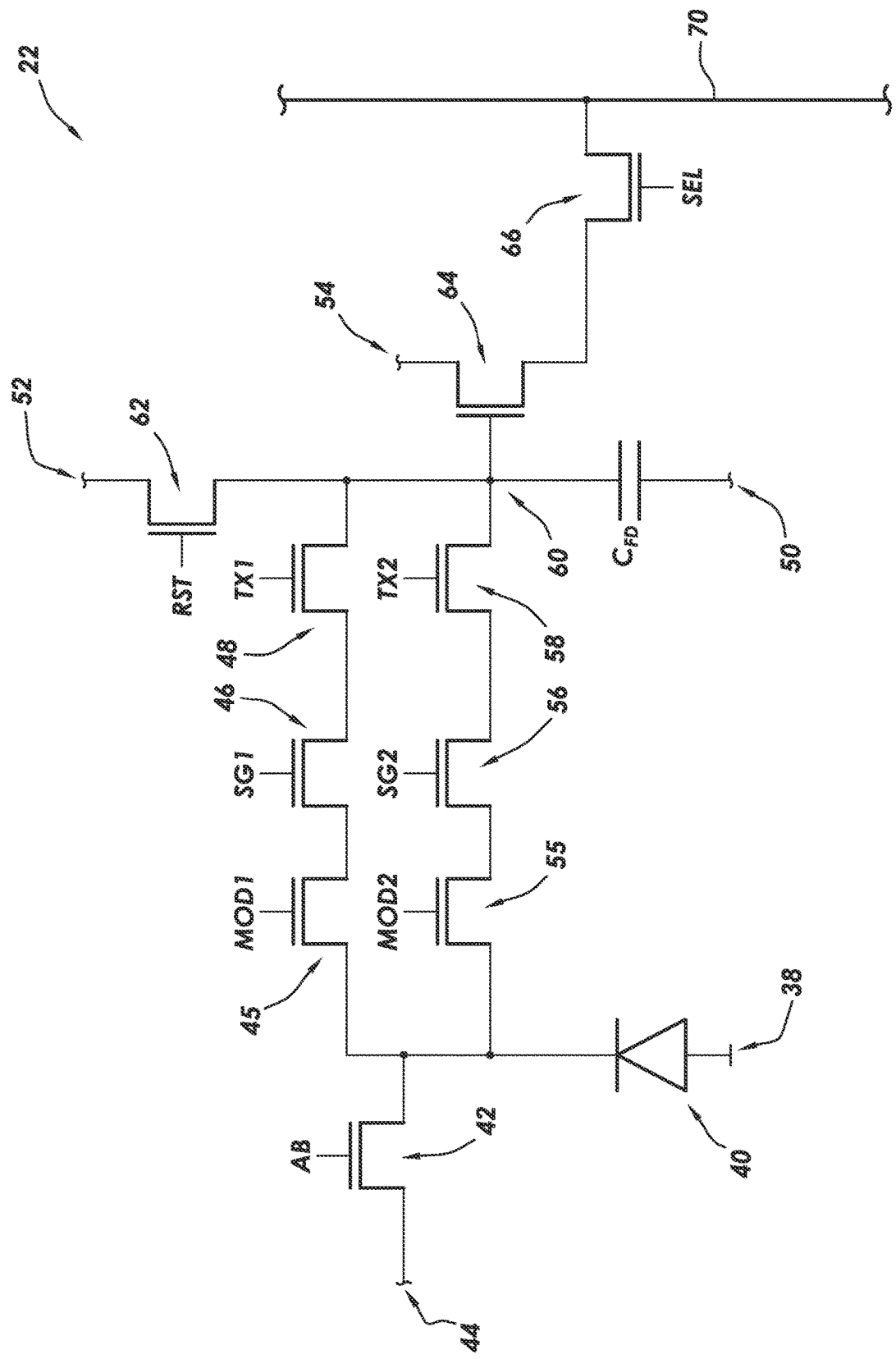
FIG. 4 is a circuit diagram of an illustrative sensor pixel in accordance with some embodiments.

FIG. 4 is a circuit diagram of an illustrative image sensor pixel 22 configured to implement each pixel 22 in array 20 of FIG. 3. Pixel 22 may include a photosensitive element such as a (pinned) photodiode 40. Photodiode 40 may receive incident light over an integration time period and may generate electric charge based on the incident light. A first terminal of photodiode 40 may be coupled to a voltage terminal 38 such as a ground voltage terminal. An anti-blooming transistor 42 may couple a second terminal of photodiode 40 to a voltage terminal 44 such as a supply voltage terminal. Transistor 42 may be configured to prevent blooming at photodiode 40 and/or may serve to keep photodiode 40 at a reset voltage level (e.g., the supply voltage level). As an example, when control signal AB is asserted (e.g., at a voltage level corresponding to a logic high that turns on transistor 42), photodiode 40 may be reset to the supply voltage level. When control signal AB is de-asserted (e.g., at a voltage level corresponding to a logic low that turns off transistor 42), photodiode 40 may begin to accumulate charge in response to incident light.

Pixel 22 may include local charge storage regions such as storage gates 46 and 56. As an example, each storage gate may include a corresponding adjustable charge transfer barrier portion and a corresponding charge storage portion over which the gate terminal is formed. In other words, control signals SG1 and SG2 may be adjusted to control the flow of charge from photodiode 40 into the charge storage regions associated with storage gates 46 and 56, respectively. The use of storage gates in pixel 22 is merely illustrative. If desired, any suitable types of charge storage regions may be used in pixel 22.

Transistors 45 and 55 may couple photodiode 40 to storage gates 46 and 56, respectively. Control signals MOD1 and MOD2 may be used to active transistors 45 and 55, respectively, and may be used to selectively transfer charge generated by photodiode to one of storage gates 46 or 56 during the integration time period. As an example, control signals MOD1 and MOD2 may be inverted versions of each other during the integration time period. As such, at most only one of transistors 45 or 55 may be activated at a given time, thereby separating image charge generated at photodiode 40 into first and second charge portions stored at storage gates 46 and 56, respectively, depending on the time periods during which respective signals MOD1 and MOD2 are asserted (e.g., depending on a sensor modulation frequency based on which pixel 22 is modulated).

Pixel 22 may include floating diffusion region 60 having an associated charge storage capacity (illustratively shown in FIG. 4 as capacitance $C_{FD}$ relative to voltage terminal 50 such as a ground voltage terminal). As an example, floating diffusion region 60 may be implemented as a doped semiconductor region (e.g., a region in a silicon substrate that is doped by ion plantation, impurity diffusion, or other doping processes). Storage gates 46 and 56 may temporarily store (portions of) image charge generated at photodiode 40 prior to transferring the stored portions of image charge to floating diffusion region 60 for readout.

Transfer transistors 48 and 58 may respectively couple storage gates 46 and 56 to floating diffusion region 60. During readout operations, each transfer transistor, when activated by control signals TX1 or TX2, may transfer a charge portion stored at the corresponding storage gate to floating diffusion region 60 for readout. A reset transistor 62 may couple floating diffusion region 60 to a voltage terminal 52 such as a supply voltage terminal. As an example, when control signal RST is asserted, floating diffusion region 60 may be reset to a reset voltage level (e.g., the supply voltage level). If desired, transistor 62 may be used to reset other portions of pixel 22 to the reset voltage level. As an example, transistor 62 in combination with transistors 48 and 58 may be used to reset storage gates 46 and 56 to the reset voltage level.

Pixel 22 may include source follower transistor 64 and row select transistor 66. Source follower transistor 64 has a gate terminal coupled to floating diffusion region a first source-drain terminal (e.g., one of a source or drain terminal) coupled to voltage terminal 54 such as a supply voltage terminal, and a second source-drain terminal (e.g., the other one of the source or drain terminal) coupled to row select transistor 66. Transistor 66 may have a gate terminal that is controlled by pixel (row or column) select control signal SEL. When control signal SEL is asserted during a pixel readout operation when reset and/or image level signals from one or more pixels 22 are being read out, a pixel output signal may be passed onto path 70 (e.g., coupled to readout path 32 in FIG. 3). The pixel output signal may be an output signal having a magnitude that is proportional to the amount of charge at floating diffusion region 60.

The configuration of pixel 22 shown in FIG. 4 is merely illustrative. If desired, pixel 22 in FIG. 4 may include one or more suitable additional elements such as additional transistors, additional charge storage structures, and/or other additional elements, may exclude one or more shown elements, and/or may replace one or more shown elements (e.g., replace storage gates 46 and 56 with other types of charge storage structures). If desired, one or more of the voltage terminals in pixel 22 may be coupled to a variable voltage source or a fixed voltage source.

Configurations in which an image sensor pixel array such as array 20 in FIG. 3 includes pixels 22 each having the implementation of pixel 22 shown in FIG. 4 are described herein as illustrative examples. If desired, the embodiments described herein may similarly apply to an array 20 having pixels 22 of other implementations.

As described in connection with FIGS. 3 and 4, pixel control circuitry 26 may provide a number of different control signals to each pixel 22 in array 20. As one illustrative example, pixel control circuitry 26 may need to provide modulation signals MOD1 and MOD2 in a specific manner to each pixel 22 in array 20 to perform indirect TOF sensing operations in a satisfactory manner. In particular, the manner in which modulation signals MOD1 and MOD2 are asserted and de-asserted contributes to the depth and spatial resolution of the indirect TOF sensing.

From the perspective of indirect TOF sensing, it may be desirable for the pixel control circuitry to concurrently assert modulation signals (MOD1 at a first time and MOD2 at second time) across the entire pixel array and to do so at a high modulation frequency. However, doing so while providing a satisfactory spatial resolution (e.g., across a satisfactory number of pixels) can require a large concurrent current draw. As an example, when providing a depth resolution of about 1 mm (with a corresponding modulation frequency of 200 MHz) and a spatial resolution of 1.2 MP for TOF sensing, the peak current drawn by the pixel array may reach 6.9 A. Accordingly, the power delivery network for the sensor module would need to quickly (e.g., within 1 ns) ramp from 0 A to 6.9 A and provide 6.9 A of current without significant supply voltage (IR) drop. This requirement of the power delivery network may be unrealistic without including bulky and/or specialized power delivery networks, which are similarly undesirably in a compact sensor module.

To mitigate these issues, the modulation of sets of pixels 22 in array 20 may be staggered or interleaved such that the current draw is spread out over the integration time period. However, especially for indirect TOF sensing, the time delay between modulation of different sets of pixels may contribute to depth error, which can be exacerbated by PVT (process-voltage-temperature) effects or other unknown effects that can make the depth error unpredictable and difficult to compensate for. It may therefore be desirable to provide a predictable depth error, which can then be relatively easily removed.

Figure 5:
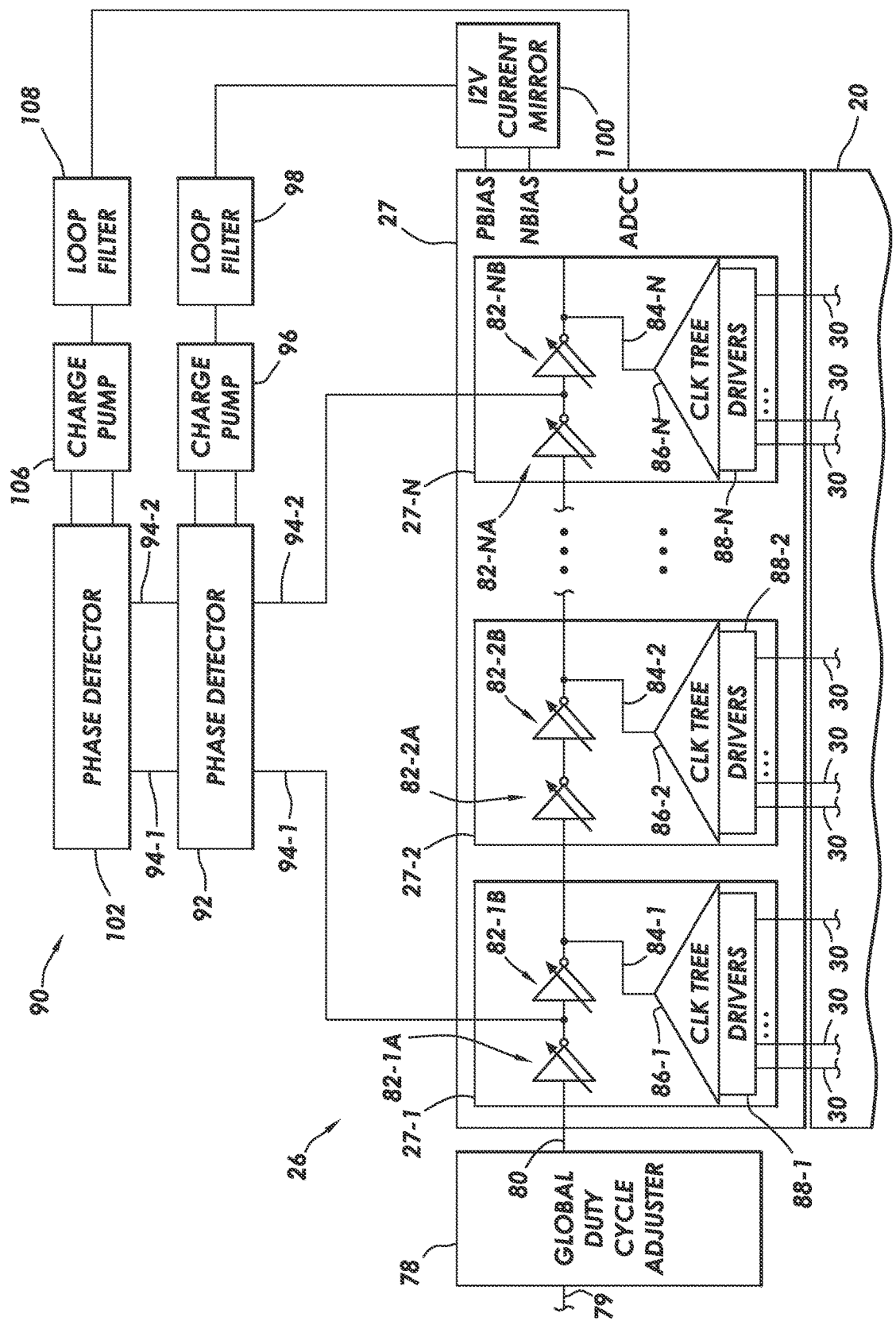
FIG. 5 is a diagram of pixel control circuitry having an adjustable delay line with delay locking in accordance with some embodiments.

FIG. 5 is a diagram of illustrative pixel control circuitry having an adjustable delay line based on which control signals such as modulation signals MOD1 and MOD2 and a global shutter control signal AB are provided to pixels 22 in array 20. As shown in FIG. 5, pixel control circuitry 26 may include driver circuitry 27. Driver circuitry 27 may include any number of driver units or cells 27-1, 27-2, . . . , 27-N. Each driver unit produces control signals such as modulation signals MOD1 and MOD2 that are conveyed to lines (columns in the example of FIG. 5) of pixels 22 in pixel array 20 via corresponding paths 30. As an explicit example, driver unit 27-1 (or any of the other driver units) may provide a common modulation signal MOD1 to one or more columns of pixels via corresponding paths 30 and may provide a common modulation signal MOD2 to one or more columns of pixels via corresponding paths 30. Collectively, driver units 27-1, 27-2, . . . , 27-N may provide control signals to each pixel 22 in array 20.

A delay line such as delay line 80 may extend across each of driver units 27-1, 27-2, . . . 27-N and may provide outputs based on which the control signals are generated. Delay line 80 may receive, at its input terminal, an input (control) signal having an adjustable duty cycle from global duty cycle adjuster 78 (sometimes referred to herein as global duty cycle adjustment circuit 78). In particular, global duty cycle adjuster 78 may receive an input control signal along path 79 and, based on the input control signal, provide (modulate) the input signal to delay line 80 with a desired duty cycle. The reference signal input to delay line 80 may have a 50% duty cycle or a non-50% duty cycle such as a 30% duty cycle, 40% duty cycle, 45% duty cycle, 55% duty cycle, 60% duty cycle, or any other desired non-50% duty cycle. Delay line 80, based on the input signal, may produce corresponding delayed versions of the input signal to each of driver units 27-1, 27-2, . . . 27-N as outputs.

As shown in FIG. 5, delay line 80 may include adjustable inverters 82 such as current-starved adjustable inverters couple in series with one another, thereby providing various incrementally delayed versions of the input signal (e.g., from adjustment circuit 78). As an example, the output terminal of inverter 82-1B may be coupled to clock tree 86-1 via path 84-1. Inverter 82-1B may provide an input signal (e.g., a version of the delay line input signal from circuit 78 delayed by inverters 82-1A and 82-B) to clock tree 86-1 via path 84-1. Clock tree 86-1 may propagate the received input signal to driver circuits 88-1 in driver unit 27-1. Based on the propagated signals received from clock tree 86-1, driver circuits 88-1 may generate (e.g., assert and de-assert) the control signals produced by driver unit 27-1 on paths 30. In general, the output terminal of inverter 82-NB may be coupled to clock tree 86-N via path 84-N. Inverter 82-NB may provide an input signal (e.g., a version of the delay line input signal from circuit 78 delayed by inverter 82-NB and all preceding upstream inverters along the delay line) to clock tree 86-N via path 84-N. Clock tree 86-N may propagate the received input signal to driver circuits 88-N in driver unit 27-N. Based on the propagated signals received from clock tree 86-N, driver circuits 88-N may generate (e.g., assert and de-assert) the control signals produced by driver unit 27-N on paths 30.

Configured in the manner described above, driver unit 27-1 may produce a first set of control signals such as modulation control signals MOD1 and MOD2 and global shutter control signal AB for a first set of pixels 22 in array 20 (e.g., a first set of pixel columns). Because the timing of these first set of control signals are based on the same signal received along path 84-1, pixels 22 coupled to driver unit 27-1 may be controlled based on the same control signal timing. As examples, control signals MOD1 received by pixels 22 coupled to driver unit 27-1 via paths 30 may be asserted and de-asserted at the same time, control signals MOD2 received by pixels 22 coupled to driver unit 27-1 via paths 30 may be asserted and de-asserted at the same time, and/or other control signals such as control signal AB received by pixels 22 coupled to driver unit 27-1 via paths 30 may be asserted and de-asserted at the same time.

In a similar manner, driver unit 27-2 may produce a second set of control signals such as modulation control signals MOD1 and MOD2 and global shutter control signal AB for a second set of pixels 22 in array 20 (e.g., a second set of pixel columns). Because the timing of these second set of control signals are based on the same signal received along path 84-2, pixels 22 coupled to driver unit 27-2 may be controlled based on the same control signal timing. As examples, control signals MOD1 received by pixels 22 coupled to driver unit 27-2 via paths 30 may be asserted and de-asserted at the same time, control signals MOD2 received by pixels 22 coupled to driver unit 27-2 via paths 30 may be asserted and de-asserted at the same time, and/or other control signals such as control signal AB received by pixels 22 coupled to driver unit 27-2 via paths 30 may be asserted and de-asserted at the same time.

Because, the signal received along path 84-2 and used in driver unit 27-2 is more delayed than the signal received along path 84-1 and used in driver unit 27-1, the control signal assertions and/or de-assertions produced on paths 30 coupled to driver unit 27-2 may also be delayed relative to the same control signal assertions and/or de-assertions produced on paths 30 coupled to driver unit 27-1. More generally, the signal received along path 84-N and used in driver unit 27-N is more delayed than the signal received along path 84-(N-1) and used in driver unit 27-(N-1), the control signal assertions and/or de-assertions produced on paths 30 coupled to driver unit 27-N may also be delayed relative to the same control signal assertions and/or de-assertions produced on paths 30 coupled to driver unit 27-(N-1).

As such, for the same control signal assertion (or de-assertion), pixels 22 coupled to driver unit 27-1 may exhibit the control signal assertion (or de-assertion) first, pixels 22 coupled to driver unit 27-2 may exhibit the control signal assertion (or de-assertion) after a delay, pixels 22 coupled to driver unit 27-3 may exhibit the control signal assertion (or de-assertion) after a further delay, and so on, until pixels 22 coupled to driver unit 27-N may exhibit the control signal assertion (or de-assertion) last.

By temporally offsetting the assertion and/or de-assertion of control signals such as control signals MOD1 and MOD2, driver circuitry 27 may draw current from a power distribution network in a distributive manner, thereby reducing peak current draw when compared to scenarios, in which control signal assertions (or de-assertions) occur simultaneously across the entire pixel array.

While this use of a delay line to offset current draw may provide satisfactory operations for some applications, in indirect TOF sensing application (as an example), the differently delayed modulation signals may cause a depth error. This depth error may be due to the modulation not occurring in a synchronous manner across the entire array, and in TOF sensing, relative timing delays translate to image data corresponding to varying depths or distances, thereby producing a depth error.

While processing circuitry in and/or coupled to the sensor module can compensate for the depth error, this type of compensation may be difficult if the relative timing delays are not fixed or at least predictable. To produce fixed and/or predictable delays, delay line 80 may be configured to exhibit a delay lock (sometimes referred to herein as a phase lock). In particular, delay lock circuitry (sometimes referred to as phase lock circuitry) may be coupled to delay line 80 and may detect undesired delay offsets or differences and adjust delay line 80 may remove these undesired delay offsets or differences, thereby producing a delay-locked delay line that outputs signals with fixed and predicable delays across the different driver units 27-1, 27-2, ..., 27-N.

As shown in FIG. 5, delay lock circuitry 90 may include phase detector 92, charge pump 96, loop filter 98, and current-to-voltage current mirror 100, which collectively may be referred to herein as a first delay lock loop of delay lock circuitry 90. Phase detector 92 may be coupled to a first tap point at the output of inverter 82-1A in the first driver unit 27-1 via path 94-1 and may be coupled to a second tap point at the output of inverter 82-NA in the last driver unit 27-N via path 94-2. Phase detector 92 may determine a phase difference between the rising edge of the signal received on path 94-1 from the output of inverter 82-1A and the rising edge of the signal received on path 94-2 from the output of inverter 82-NA. For example, the rising edge of the signal received on path 94-1 and the rising edge of the signal received on path 94-1 may be desirably offset by integer multiples of half of the period of the signal (e.g., half of the period or the period). Phase detector 92 may detect any phase differences from these desired offsets between the rising edges of the two phase detector inputs.

Based on the determined phase difference, phase detector 92 may output signals (e.g., up and down gating signals) to charge pump 96, thereby controlling charge pump 96 to provide current to loop filter 98 or to draw current from loop filter 98. Current-to-voltage current mirror 100 may convert the corresponding current flow or draw from loop filter 98 to corresponding bias voltages PBIAS and NBIAS. Each inverter 82 along delay line 80 may receive bias voltages PBIAS and NBIAS, which are used to control the adjustable delay provided by inverters 82. In particular, bias voltages PBIAS and NBIAS may be used to control inverters 82 to output signals such that the rising edges of the signals on paths 94-1 and 94-2 are aligned, thereby achieving a delay lock (e.g., a half period phase lock or a full period phase lock) at least with respect to the rising edges.

As shown in FIG. 5, delay lock circuitry 90 may also include phase detector 102, charge pump 106, loop filter 108, which collectively may be referred to herein as a second delay lock loop of delay lock circuitry 90. Phase detector 102 may also be coupled to the first tap point at the output of inverter 82-1A in the first driver unit 27-1 via path 94-1 and may also be coupled to the second tap point at the output of inverter 82-NA in the last driver unit 27-N via path 94-2. Phase detector 102 may determine a phase difference between the falling edge of the signal received on path 94-1 from the output of inverter 82-1A and the falling edge of the signal received on path 94-2 from the output of inverter 82-NA. For example, the falling edge of the signal received on path 94-1 and the falling edge of the signal received on path 94-1 may be desirably offset by integer multiples of half of the period of the signal (e.g., half of the period or the period). Phase detector 102 may detect any phase differences from these desired offsets between the falling edges of the two phase detector inputs.

Based on the determined phase difference, phase detector 102 may output signals (e.g., up and down gating signals) to charge pump 106, thereby controlling charge pump 106 to provide current to loop filter 108 or to draw current from loop filter 108. This current flow or draw from loop filter 108 may produce a corresponding bias voltage ADCC. Each inverter 82 along delay line 80 may receive bias voltage ADCC, which is used to control, in combination with bias voltages PBIAS and NBIAS, the adjustable duty cycle provided by inverters 82. In particular, bias voltage ADCC may be used to control inverters 82 to output signals such that the falling edges of the signals on paths 94-1 and 94-2 are aligned, thereby achieving a delay lock (e.g., a full period phase lock) at least with respect to the falling edges.

By separately phase locking the rising and falling edges of the reference signal passed along the delay line, even when the reference signal does not have a 50% duty cycle, the non-50% duty cycle reference signal may still be delay locked.

The configuration of adjustable delay line 80 with adjustable inverters 82 as shown in FIG. 5 is merely illustrative. In configurations sometimes described herein as an illustrative example, each control signal such as modulation control signal MOD1, modulation control signal MOD2, and/or a global shutter control signal AB may have its own dedicated adjustable delay line 80 with adjustable inverters 82. In particular, in the example of control signals MOD1, MOD2, AB, three parallel adjustable delay lines 80 may be provided in the pixel control circuitry. These three parallel adjustable lines 80 may share the same bias voltages PBAIS, NBIAS, and ADCC. In other words, inverters 82 in the three parallel adjustable lines 80 may receive the same global bias voltages. Delay lock circuitry 90 may generate global bias voltages PBIAS, NBIAS, and ADCC based on tapping any one of the three delay lines. However, inverters 82 in each of the three parallel adjustable lines 80 may receive different (independently controllable) inverter-specific voltages and/or control signals with respect to inverters 82 in the other two parallel adjustable lines 80. These inverter-specific voltages and/or control signals are further illustrated in FIG. 6.

Figure 6:
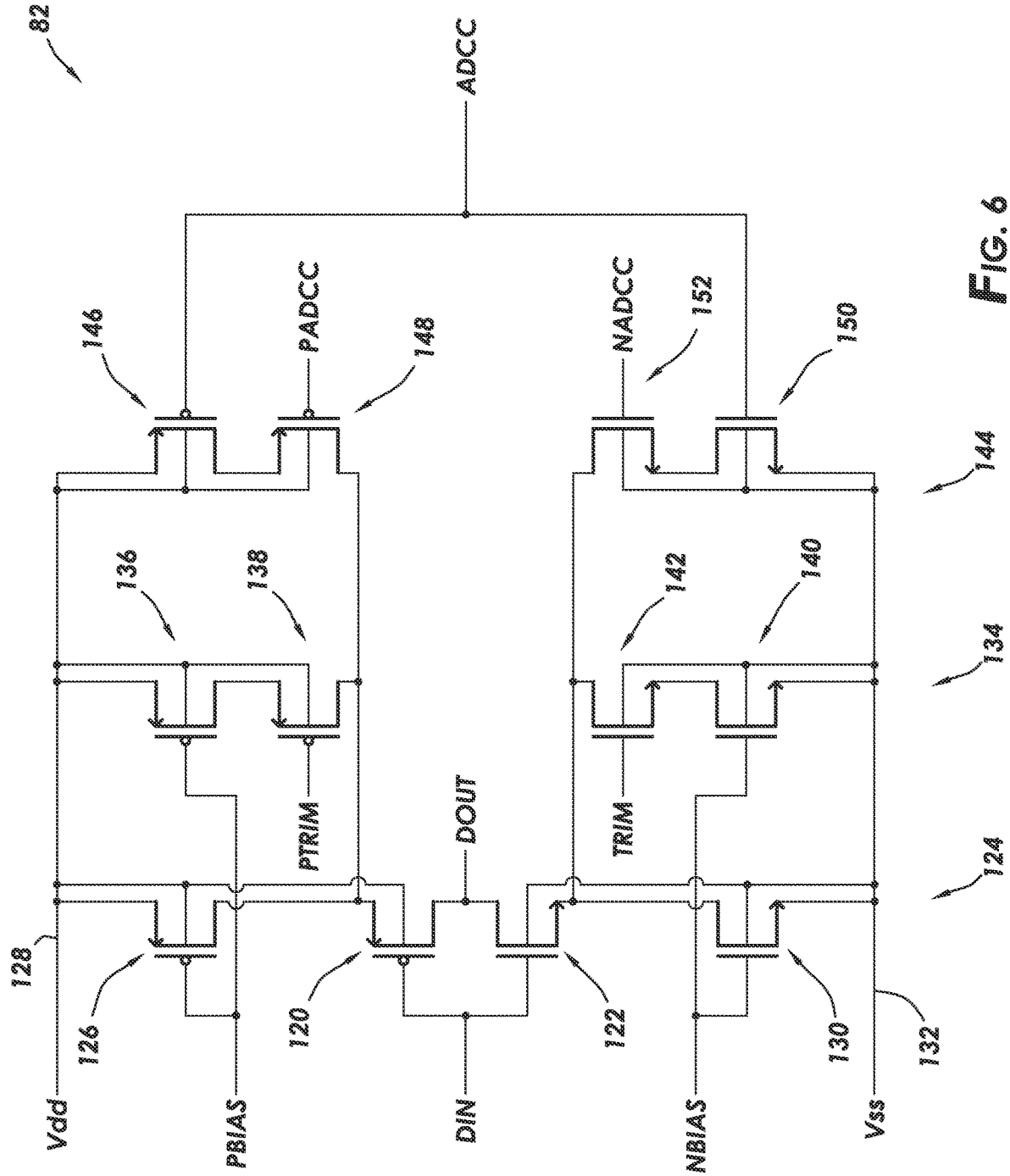
FIG. 6 is a circuit diagram of an illustrative adjustable inverter in accordance with some embodiments.

FIG. 6 is a diagram of an illustrative voltage-controlled current-starved adjustable inverter of the type used to implement inverters 82 on delay line 80 in FIG. 5. As shown in FIG. 6, inverter 82 may include PMOS (p-channel metal-oxide-semiconductor) transistor 120 and NMOS (n-channel metal-oxide semiconductor) transistor 122 having a common gate terminal coupled to the input DIN of inverter 82 and having a common drain terminal coupled to the output DOUT of inverter 82. Inverter 82 may include a main branch 124 with PMOS transistor 126 coupled between PMOS transistor 120 and voltage terminal or rail 128 supplying power supply voltage Vdd and with NMOS transistor 130 coupled between voltage terminal or rail 132 supplying ground voltage Vss. Transistor 126 may receive, at its gate terminal, bias voltage PBIAS. Transistor 130 may receive, at its gate terminal, bias voltage NBIAS. Bias voltages PBIAS and NBIAS may be used to adjust the delay introduced between the input and output of inverter 82. In particular, by increasing voltage PBIAS and/or decreasing NBIAS, the effective drive resistance of transistors 120 and 122 may be increases, thereby increasing the delay introduced by inverter 82.

Inverter 82 may also include a second branch 134 with PMOS transistors 136 and 138 coupled in series between PMOS transistor 120 and voltage rail 128 and with NMOS transistors 140 and 142 coupled in series between NMOS transistor 122 and voltage rail 132. Transistor 136 may receive, at its gate terminal, bias voltage PBIAS. Transistor 138 may receive, at its gate terminal, control voltage PTRIM. Transistor 140 may receive, at its gate terminal, bias voltage NBIAS. Transistor 142 may receive, at its gate terminal, control voltage NTRIM. Transistors 136 and 138 may be coupled in parallel with transistor 126 between transistor 120 and voltage terminal 128. Transistors 140 and 142 may be coupled in parallel with transistor 130 between transistor 122 and voltage terminal 132.

While bias voltages PBIAS and NBIAS are shared (common) bias voltages provided to all inverters 82 along delay line 80, control voltages PTRIM and NTRIM may be local bias voltages that can vary across different inverters. This set of localized bias voltages enable inverters 82 (e.g., a pair of inverters) associated with each driver unit to be controlled and adjusted independently from inverters 82 associated other driver units.

Inverter 82 may also include a third branch 144 with PMOS transistors 146 and 148 coupled in series between PMOS transistor 120 and voltage rail 128 and with NMOS transistors 150 and 152 coupled in series between NMOS transistor 122 and voltage rail 132. Transistor 146 and transistor 150 may receive, at their common gate terminals, bias voltage ADCC. Transistor 148 may receive, at its gate terminal, bias voltage PADCC. Transistor 152 may receive, at its gate terminal, bias voltage NADCC. Transistors 146 and 148 may be coupled in parallel with transistor 126 between transistor 120 and voltage terminal 128. Transistors 150 and 152 may be coupled in parallel with transistor 130 between transistor 122 and voltage terminal 132.

While transistors 126 and 130 in the first branch and transistors 136, 138, 140, and 142 in the second branch may be used to control the delay of the rising edges of the input signal received by inverter 82, transistors 146, 148, 150, and 152 may be used to control the delay of the falling edges of the input signal received by inverter 82. While not explicitly shown in FIG. 5 or 6, a portion of phase lock circuitry 90 in FIG. 5 may provide independently controlled local control voltages PTRIM, NTRIM, PADCC, and NADCC along separate paths to each inverter 82 in delay line 80, thereby providing local bias voltage (and therefore delay) adjustments to each inverter 82. In this context, bias voltages PBIAS, NBIAS, and ADCC may be global bias voltages shared across each inverter 82, while control voltages PTRIM, NTRIM, PADCC, and NADCC may be local control voltages that are inverter-specific. In some configurations described herein as an illustrative example, control voltages PTRIM, NTRIM, PADCC, and NADCC may each provide a logic high voltage or a logic low voltage selectively turn the controlled transistor (and corresponding inverter branches) on or off.

Figure 7:
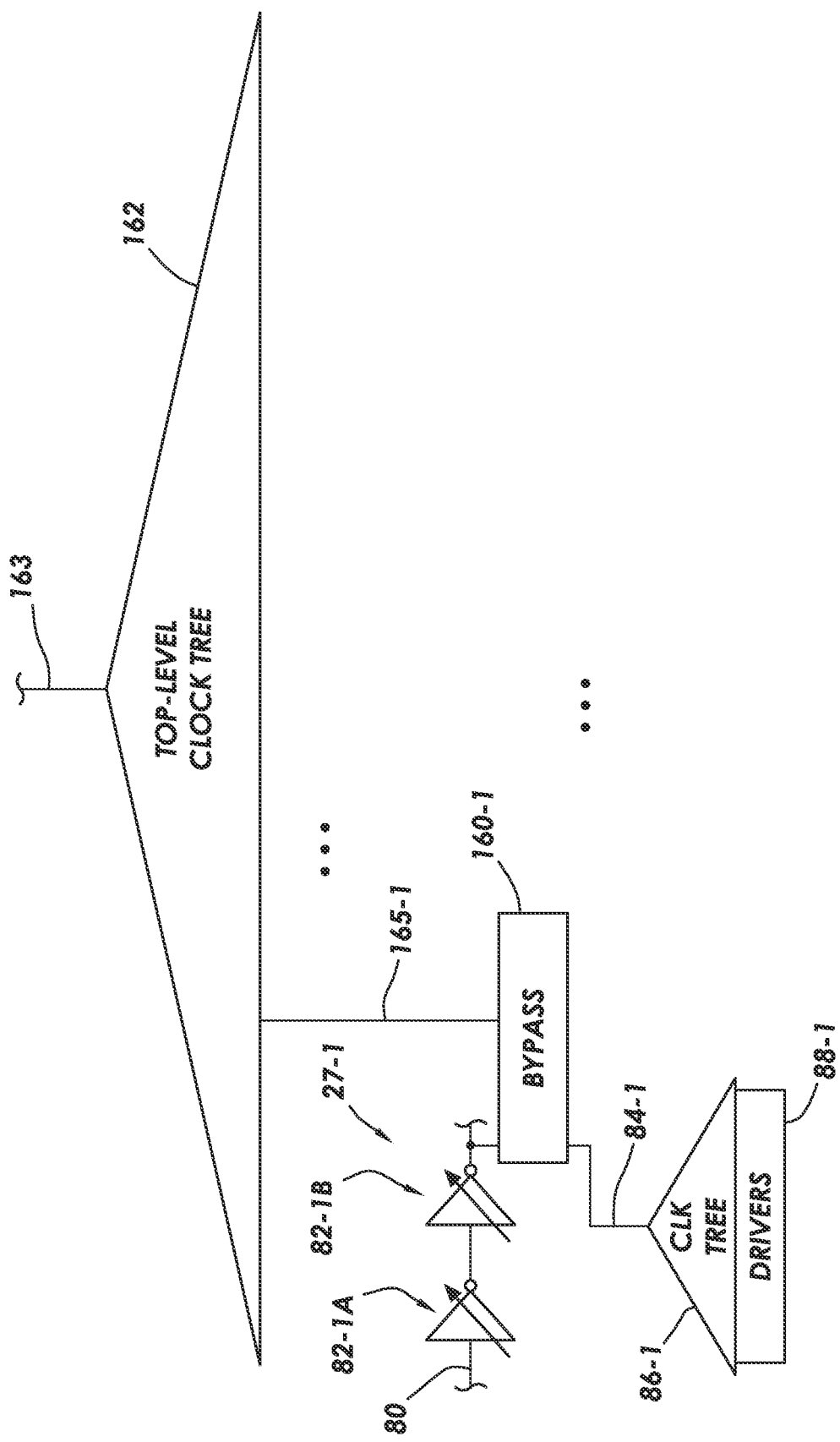
FIG. 7 is a diagram of an illustrative bypass circuit coupled between the adjustable delay line and a sub-clock tree in accordance with some embodiments.

FIG. 7 is an illustrative diagram of an illustrative bypass circuit configured to bypass outputs from delay line 80. As shown in FIG. 7, a bypass circuit 160-1 may be coupled along path 84-1 between the output of inverter 82-1B and clock tree 86-1. In particular, in additional to a voltage-controlled delay line 80, sensor module 16 may also include a top-level clock tree 162 that distributes one or more reference control signals on corresponding input path(s) 163 to each of the driver units in driver circuitry 27. As examples, top-level clock tree 162 may distribute modulation control signal MOD1 received along a first path 163, modulation control signal MOD2 received along a second path 163, a global shutter control signals AB received along a third path 63, and/or any other control signals, if desired. In other words, top-level clock tree 162 may output (balanced) control signals of each input control signal along paths 165 to each driver unit in driver circuitry 27 based on the reference input signal on each path 163. An illustrative path 165-1 (e.g., for one of the distributed modulation signals such as one of signal MOD1, MOD2, or AB) of all of the paths 165 is shown in FIG. 7. Bypass circuit 160-1, when activated, may supply lower-level clock tree 86-1 with the distributed control signal on path 165-1 instead of the control signal produced on delay line 80. A corresponding bypass circuit 160 may be provided for each driver unit in driver circuitry 27.

By providing bypass circuits, the distributed control scheme imparted by the delay line as described in connection with FIG. 5 may selectively deactivated. While the use of the balanced control signals from top-level clock tree 162 via paths 165 at each driver unit in driver circuitry 27 may contribute to large current draw, this configuration (e.g., activation of bypass circuit 160-1 and use of signals from top-level clock tree 162) may enable testing and/or calibration of components within image sensor 160 and/or may be used for other purposes.

The configuration of FIG. 7 is merely illustrative. While not explicitly shown in FIG. 7, additional paths 163, 165-1, 84-1 may also be included, e.g., for the other control signals distributed by top-level clock tree 162. In other words, when distributing three control signals such as control signals MOD1, MOD2, and AB, paths 163, 165-1, and 84-1 may each contain three parallel paths, one for each of the control signals. These additional paths may be coupled to other bypass circuits on other delay lines (e.g., because each control signal may also have its own delay line) before being coupled to clock tree 86-1 and distributed to drivers 88-1.

Figure 8:
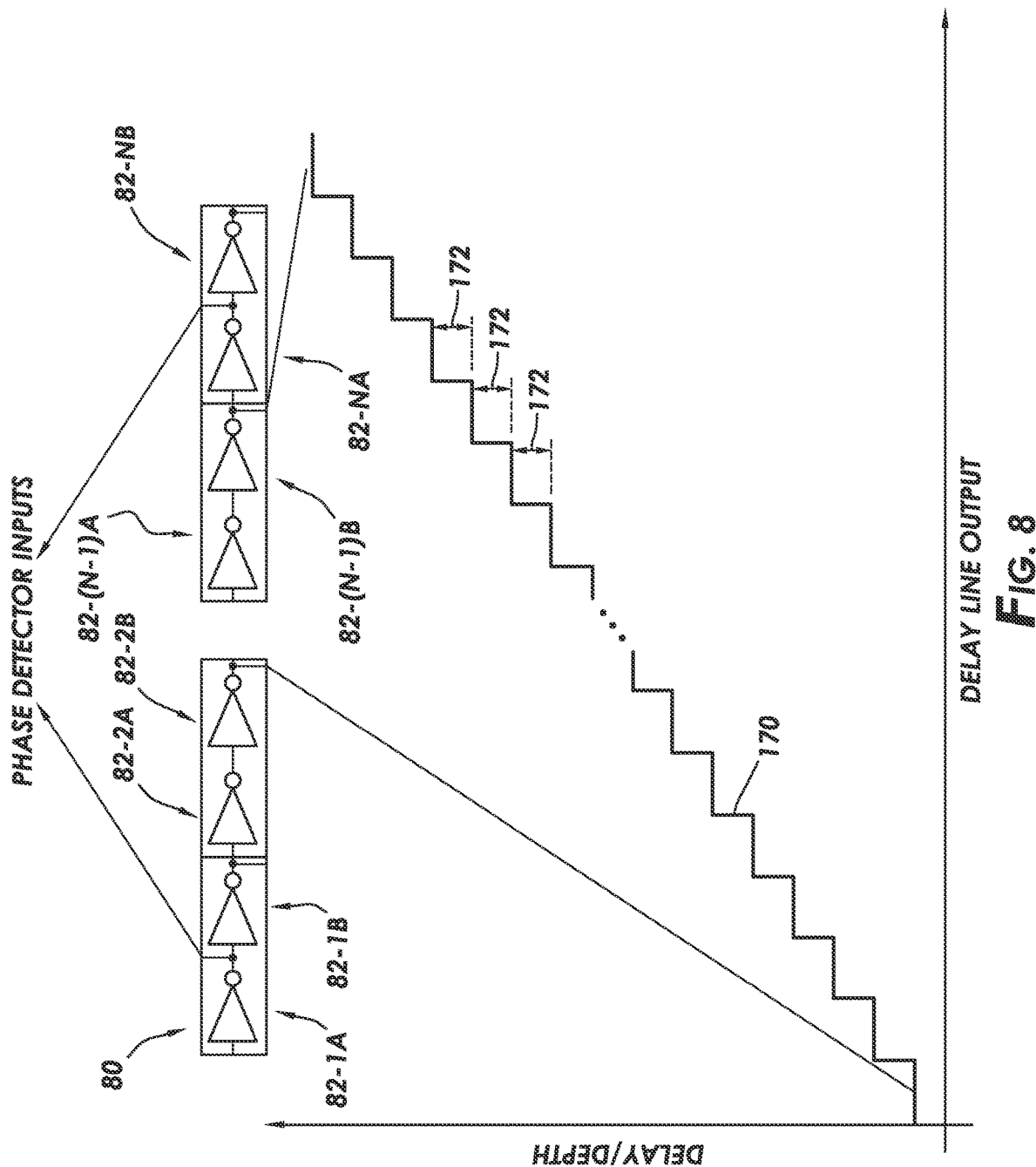
FIG. 8 is a graph showing an illustrative step function indicative of the delay across the adjustable delay line in accordance with some embodiments.

FIG. 8 is an illustrative graph of the relative delay or depth across the output of a delay line such as delay line 80 of FIG. 5. In the example of FIG. 8, the relative delay or depth of the in-phase outputs of inverters 82 on delay line 80 (e.g., the outputs of every other inverter) starting with inverter 82-2B and ending with inverter 82-(N-1)B exhibit staircase function 170. Each step 172 (e.g., each step delay or depth) of staircase function should be of the same magnitude. This characteristic may be enabled by taping and locking the phases of the signals at the ends of delay line 80 (e.g., outputs from inverters 82-1A and 82-NA) by delay lock circuitry 90 (FIG. 5).

Figure 9:
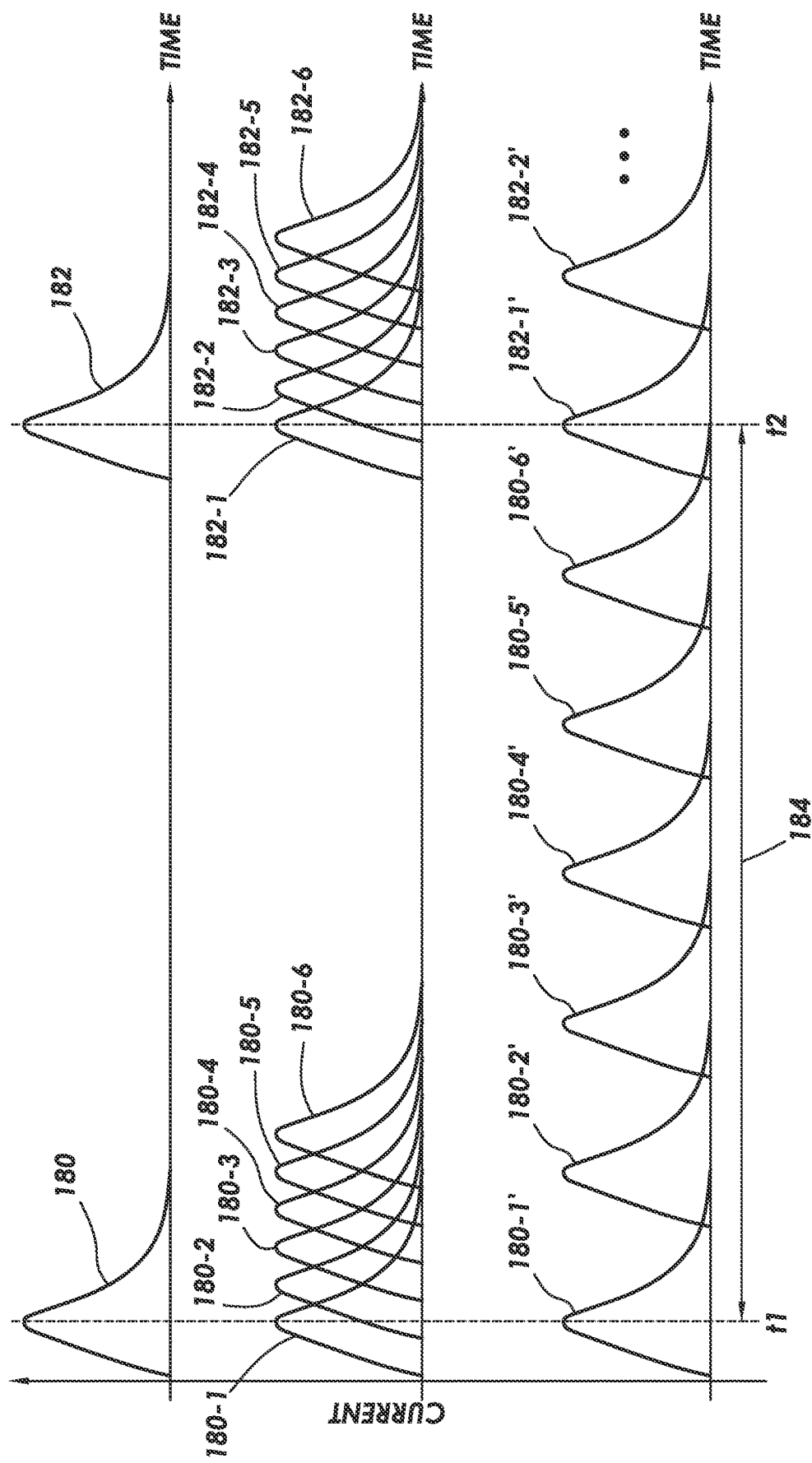
FIG. 9 are graphs showing illustrative current draw characteristics in three different pixel control schemes in accordance with some embodiments.

FIG. 9 shows three sets of graphs illustrating how current draw across time differs between three different control schemes. In the example of the topmost graph, the assertions of a control signal such as control signal MOD1 may occur across all pixels 22 in array 20 concurrently at time t1, thereby exhibiting a single large current draw shown by curve 180. Similarly, the assertions of a control signal such as control signal MOD2 may occur across all pixels 22 in array 20 concurrently at time t2, thereby exhibiting a single large current draw shown by curve 182. As an example, this type of operation may occur when sub-level clock trees 86 receive reference signals from top-level clock tree 163 (e.g., as shown in FIG. 7) but may be undesirable the strain placed on the power delivery network of the sensor module.

In the example of the middle graph, the assertions of a control signal such as control signal MOD1 may occur in a slightly offset manner across six different groups (e.g., sets of columns) of pixels 22 in array 20 beginning at time t1, thereby exhibiting six sets of current draws shown by curves 180-1, 180-2, 180-3, 180-4, 180-5, and 180-6. Similarly, the assertions of a control signal such as control signal MOD2 may occur in a slightly offset manner across six different groups (e.g., sets of columns) of pixels 22 in array 20 beginning at time t2, thereby exhibiting six sets of current draws shown by curves 182-1, 182-2, 182-3, 182-4, 182-5, and 182-6. While this type of operation may result in a more spread out current draw (and therefore a lower peak current) than the current draw shown by curves 180 and 182, the peak current draw may still be undesirably elevated.

In the example of the bottommost graph, the assertions of a control signal such as control signal MOD1 may occur in a regularly (evenly) spaced offset manner across six different groups (e.g., sets of columns) of pixels 22 in array 20 beginning at time t1, thereby exhibiting six sets of evenly spread out current draws shown by curves 180-1', 180-2', 180-3', 180-4', 180-5', and 180-6'. Similarly, the assertions of a control signal such as control signal MOD2 may occur in a regularly (evenly) spaced offset manner across six different groups (e.g., sets of columns) of pixels 22 in array 20 beginning at time t2, thereby exhibiting six sets of evenly spread out current draws shown by curves 182-1', 182-2', . . . , 182-6'. As an example, this type of operation may occur when sub-level clock trees 86 receive reference signals from phase-locked delay line 80 (e.g., as shown in FIGS. 5 and 7). By using phase lock circuitry 90, each driver unit in driver circuitry 27 may produce evenly delayed sets of control signals relative to the preceding driver units. Accordingly, current draw may be evenly distributed as the control signal assertions and/or assertions for different sets of pixels are offset based on the driver unit to which each set of pixels is coupled.

While the peak current draw shown by each of the graphs appear to be similar in FIG. 9, this is merely illustrative and may not be to scale. As an example, the peak current draw exhibited by curve 180 may be at least 5 times, at least 6 times, at least times, at least 50 times larger than any of the peak current draws exhibited by curves 180-1', 180-2', . . . , 180-6'. While the current draw is distributed across 6 different time periods (e.g., associated with 6 sets of assertions for 6 sets of pixels 22), this is merely illustrative. If desired, assertions for a particular control signal may be distributed across any number of time periods (e.g., based on the number of different driver units in driver circuitry 27).

In the example of curves 180 (e.g., 180-1', 180-2', etc.) being associated with control signal MOD1 and curves 182 (e.g., 182-1', 180-2', etc.) being associated with control signal MOD2, time period 184 may be half of the period of the modulation signal (e.g., control signal MOD1 is asserted in an evenly distributed manner during half of each period and control signal MOD2 is asserted in an evenly distributed manner during the other half of each period). If desired, time period 184 may be the period of a reference signal or may be any suitable length of time relative to the reference signal (e.g., in scenarios in which curves 180 and 182 are associated with the same control signal).

Various embodiments have been described illustrating systems and methods for phase-locked and distributed control of pixels in an array.

As an example, an imaging module may include an array of image sensor pixels, a voltage-controlled delay line having a plurality of outputs, delay lock circuitry coupled to the voltage-controlled delay line and configured to control the voltage-controlled delay line to provide the plurality of outputs with distributed delays based on a plurality of bias voltages, and a plurality of driver units each coupled to a corresponding output in the plurality of outputs and each configured to generate a control signal for a corresponding set of pixels in the array based on the corresponding output.

As another example, a sensor module configured to perform time-of-flight sensing may include an array of image sensor pixels, each image sensor pixel configured to receive a modulation control signal based on which image charge for the time-of-flight sensing is modulated, driver circuitry comprising a plurality of driver units, each driver unit providing the modulation control signal for a different set of image sensor pixels in the image sensor pixels, a delay line configured to provide each driver unit in the plurality of driver units with a corresponding output signal, and delay lock circuitry coupled to the delay line and configured to control the delay line to exhibit a fixed delay across the delay line.

As yet another example, a voltage-controlled delay line may include a plurality of inverters coupled in series. Each inverter in the plurality of inverters may include first and second transistors having a common gate terminal configured to receive an input signal and having a common drain terminal coupled to provide an output signal, a third transistor coupled between a first voltage terminal and the first transistor, a fourth transistor coupled between a second voltage terminal and the second transistor, fifth and sixth series-coupled transistors coupled in parallel with the third transistor between the first voltage terminal and the first transistor, seventh and eighth series-coupled transistors coupled in parallel with the fourth transistor between the second voltage terminal and the second transistor. The third transistor of each inverter in the plurality of inverters is configure to receive a same first bias voltage, the fourth transistor of each inverter in the plurality of inverters is configured to receive a same second bias voltage, the sixth transistor of each inverter in the plurality of inverters is configured to receive a third bias voltage that is independently controlled across the plurality of inverters, and the eighth transistor of each inverter in the plurality of inverters is configured to receive a fourth bias voltage that is independently controlled across the plurality of inverters.

The foregoing is merely illustrative of the principles of this invention and various modifications can be made by those skilled in the art without departing from the scope and spirit of the invention. The foregoing embodiments may be implemented individually or in any combination.

What is claimed is:

1. An imaging module comprising:
   an array of image sensor pixels;
   a voltage-controlled delay line having a plurality of outputs;
   delay lock circuitry coupled to the voltage-controlled delay line and configured to control the voltage-controlled delay line to provide the plurality of outputs with distributed delays based on a plurality of bias voltages, wherein the delay lock circuitry includes:
     a first phase detector that receives a first signal from a first location on the voltage-controlled delay line and receives a second signal from a second location on the voltage-controlled delay line, and
     a second phase detector that receives the first signal and the second signal; and
   a plurality of driver units each coupled to a corresponding output in the plurality of outputs and each configured to generate a control signal for a set of image sensor pixels in the array based on the corresponding output.

2. The imaging module defined in claim 1, wherein the voltage-controlled delay line comprises a plurality of inverters coupled in series and each output in the plurality of outputs is provided by an output of a corresponding inverter in the plurality of inverters.

3. The imaging module defined in claim 2, wherein the first phase detector has a first input coupled to a first inverter in the plurality of inverters and has a second input coupled to a second inverter in the plurality of inverters.

4. The imaging module defined in claim 3, wherein the first location is an output of the first inverter, wherein the second location is an output of the second inverter, wherein the delay lock circuitry is configured to determine a phase difference between the first signal and the second signal and to generate first and second bias voltages using the first phase detector, and wherein the delay lock circuitry is configured to control the voltage-controlled delay line based on the first and second bias voltages.

5. The imaging module defined in claim 4, wherein the delay lock circuitry further comprises:
   a charge pump coupled to the first phase detector;
   a loop filter coupled to the charge pump; and
   a current mirror coupled to the loop filter and configured to produce the first and second bias voltages.

6. The imaging module defined in claim 3, wherein the second phase detector has a first input coupled to the first inverter and has a second input coupled to the second inverter.

7. The imaging module defined in claim 6, wherein the first location is an output of the first inverter, wherein the second location is an output of the second inverter, wherein the delay lock circuitry is configured to determine a phase difference between the first signal and the second signal and to generate a bias voltage using the second phase detector and wherein the delay lock circuitry is configured to control the voltage-controlled delay line based on the bias voltage.

8. The imaging module defined in claim 1, wherein the delay lock circuitry further comprises:
   a first charge pump coupled to the first phase detector, wherein the first charge pump and the first phase detector form a first delay lock loop that produces at least one bias voltage for the voltage-controlled delay line; and
   a second charge pump coupled to the second phase detector, wherein the second charge pump and the second phase detector form a second delay lock loop that produces at least another bias voltage for the voltage-controlled delay line.

9. The imaging module defined in claim 2, wherein each inverter in the plurality of inverters comprises a current-starved inverter and wherein the current-starved inverters are each configured to receive a common first bias voltage from the delay lock circuitry, a common second bias voltage from the delay lock circuitry, and a common third bias voltage from the delay lock circuitry.

10. The imaging module defined in claim 9, wherein the current-starved inverters are each configured to receive corresponding local bias voltages that are different than local bias voltages received by at least one other of the current-starved inverters.

11. The imaging module defined in claim 1 further comprising:
   a duty cycle adjustment circuit coupled to an input of the voltage-controlled delay line.

12. The imaging module defined in claim 1, wherein the plurality of driver units each comprises a clock tree coupled to the corresponding output in the plurality of outputs of the voltage-controlled delay line.

13. The imaging module defined in claim 12, wherein the plurality of driver units each comprises a bypass circuit coupled between the corresponding output in the plurality of outputs of the voltage-controlled delay line and the clock tree and coupled to a corresponding output of a top-level clock tree.

14. The imaging module defined in claim 1, wherein the voltage-controlled delay line comprises a plurality of inverters and wherein each inverter in the plurality of inverters comprises:
   first and second transistors having a common gate terminal configured to receive an input signal and having a common drain terminal coupled to provide an output signal;
   a third transistor coupled between a first voltage terminal and the first transistor;
   a fourth transistor coupled between a second voltage terminal and the second transistor;
   fifth and sixth series-coupled transistors coupled in parallel with the third transistor between the first voltage terminal and the first transistor; and
   seventh and eighth series-coupled transistors coupled in parallel with the fourth transistor between the second voltage terminal and the second transistor.

15. The imaging module defined in claim 14, wherein the third transistor of each inverter in the plurality of inverters is configured to receive a same first bias voltage, wherein the fourth transistor of each inverter in the plurality of inverters is configured to receive a same second bias voltage, wherein the sixth transistor of each inverter in the plurality of inverters is configured to receive a third bias voltage that is independently controlled across the plurality of inverters, and wherein the eighth transistor of each inverter in the plurality of inverters is configured to receive a fourth bias voltage that is independently controlled across the plurality of inverters.

16. A sensor module configured to perform time-of-flight sensing comprising:
   an array of image sensor pixels, each image sensor pixel configured to receive a modulation control signal based on which image charge for the time-of-flight sensing is modulated;

driver circuitry comprising a plurality of driver units, each driver unit providing the modulation control signal for a different set of image sensor pixels in the image sensor pixels;

a delay line configured to provide each driver unit in the plurality of driver units with a corresponding output signal; and delay lock circuitry coupled to the delay line and configured to control the delay line to exhibit a fixed delay across the delay line, wherein the delay lock circuitry comprises:

a first delay lock loop configured to align rising edges based on first and second global bias voltages to provide the fixed delay across the delay line, and a second delay lock loop configured to align falling edges based on a third global bias voltage to provide the fixed delay across the delay line.

17. The sensor module defined in claim 16, wherein the delay line comprises a plurality of series-coupled inverters and wherein the delay lock circuitry is configured to provide local bias voltages to each inverter in the plurality of series-coupled inverters that are independently controlled across the plurality of series-coupled inverters.

18. The sensor module defined in claim 16, wherein the first delay lock loop receives a signal from a location on the delay line and wherein the second delay lock loop receives the signal from the location on the delay line.

19. The sensor module defined in claim 16, wherein the first delay lock loop comprises a first phase detector based on which the first and second global bias voltages are generated and wherein the second delay lock loop comprises a second phase detector based on which the third global bias voltage is generated.

20. An imaging module comprising:

an array of image sensor pixels;

a voltage-controlled delay line having a plurality of outputs;

delay lock circuitry coupled to the voltage-controlled delay line and configured to control the voltage-controlled delay line to provide the plurality of outputs with distributed delays based on a plurality of bias voltages; and a plurality of driver units each coupled to a corresponding output in the plurality of outputs and each configured to generate a control signal for a set of image sensor pixels in the array based on the corresponding output, wherein the plurality of driver units each comprises:

a clock tree coupled to the corresponding output, and a bypass circuit coupled between the corresponding output and the clock tree.

\* \* \* \* \*